(12) United States Patent
Zhang et al.

(10) Patent No.: US 7,562,279 B2
(45) Date of Patent: Jul. 14, 2009

(54) 2D-NORMALIZED MIN-SUM DECODING FOR ECC CODES

(75) Inventors: Juntan Zhang, North Potomac, MD (US); Daqing Gu, Burlington, MA (US); Jinyun Zhang, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 449 days.

(21) Appl. No.: 11/134,545

(22) Filed: May 20, 2005

(65) Prior Publication Data

US 2006/0282742 A1    Dec. 14, 2006

(51) Int. Cl.
*H03M 13/00* (2006.01)

(52) U.S. Cl. .................................... 714/752; 714/786

(58) Field of Classification Search ............... 714/752, 714/786
See application file for complete search history.

(56) References Cited

U.S. PATENT DOCUMENTS

2007/0276895 A9* 11/2007 Winstead et al. ............ 708/490

OTHER PUBLICATIONS

Nhuyen et al. "a 0.8v CMOS analog decoder for an (8,4,4) extended Hamming code," Proc., IEEE international symposium on circuits and system, ISCAS 2004, Canada, May 23, 2004 pp. 1116-1119.
Kschischang et al. "factor graphs and the sum-product algorithm," IEEE transactions on information theory, Feb. 2001 pp. 498-519.
Zhang et al. "Improved min-sum decoding of LDPC codes using 2-dimentional normalization," IEEE global telecommunication conference, Nov. 28, 2005.
Zhang et al. "Two-dimentional correction for min-sum decoding of irregular LDPC codes," IEEE communications letters IEEE USA, Mar. 2006.
J. Hagenauer, E. Offer and L. Papke, "Iterative decoding of binary block and convolutional codes," IEEE Trans. on Inform., vol. 42, pp. 429-445, Mar. 1996.

* cited by examiner

*Primary Examiner*—Esaw T Abraham
(74) *Attorney, Agent, or Firm*—Dirk Brinkman; Gene Vinokur

(57) ABSTRACT

A method for decoding error-correcting codes normalizes messages generated by a bit node processor, and normalizes messages generated by the check node processor.

12 Claims, 5 Drawing Sheets

2D-NORMALIZED MIN-SUM DECODING FOR ECC CODES

FIELD OF THE INVENTION

This invention relates generally to decoding error-correcting codes (ECC), and more particularly to normalized min-sum decoders for LDPC codes and repeat accumulate codes.

BACKGROUND OF THE INVENTION

Efficient and reliable data storage and communication requires practical encoding and decoding methods for error-correcting codes. It is known that low density parity check (LDPC) codes with belief propagation (BP) decoding provide performance close to the Shannon limit. In particular, irregular LDPC codes are among the best for many applications. Various irregular LDPC codes have been accepted or being considered for various communication and storage standards, such as DVB/DAB, wireline ADSL, IEEE 802.11n, and IEEE 802.16. However, it is known that the performance of irregular LDPC decoders is less than optimal.

Although BP decoding for these LDPC codes provides excellent performance, it is too complex for hardware implementation. BP decoding can be simplified by a check node processor with a simple minimum operation, resulting in a min-sum decoding method. While the min-sum decoding method is less complex to implement, it has decreased performance compared to BP decoding. The min-sum decoding method can be improved by linear post-normalization at a check node processor, which is called the normalized min-sum decoding method. Nevertheless, there is still a big gap between the performance of the normalized min-sum decoding method and BP decoding, especially for decoding irregular LDPC codes.

LDPC Codes

LDPC codes were first described by Gallager in the 1960s. LDPC codes perform remarkably close to Shannon limit. A binary (N, K) LDPC code, with a code length N and dimension K, is defined by a parity check matrix H of (N-K) rows and N columns. Most entries of the matrix H are zeros and only a small number the entries are ones, hence the matrix H is sparse. Each row of the matrix H represents a check sum, and each column represents a variable, e.g., a bit or symbol. The LDPC codes described by Gallager are regular, i.e., the parity check matrix H has constant-weight rows and columns.

In 1993, similar iterative methods were shown to perform very well for a new class of codes known as "turbo-codes." The success of turbo-codes was partially responsible for greatly renewed interest in LDPC codes and iterative decoding methods. There has been a considerable amount of recent work to improve the performance of iterative decoding methods for both turbo-codes and LDPC codes, and other related codes such as "turbo product codes" and "repeat-accumulate codes." For example, a special issue of the IEEE Communications Magazine was devoted to this work in August 2003. For an overview, see C. Berrou, "*The Ten-Year-Old Turbo Codes are entering into Service*," IEEE Communications Magazine, vol. 41, pp. 110-117, August 2003 and T. Richardson and R. Urbanke, "*The Renaissance of Gallager's Low-Density Parity Check Codes*," IEEE Communications Magazine, vol. 41, pp. 126-131, August 2003.

Regular LDPC codes can be extended to irregular LDPC codes, in which the weight of rows and columns vary. An irregular LDPC code is specified by degree distribution polynomials v(x) and c(x), which define the variable and check node degree distributions, respectively. More specifically, let $$v(x) = \sum_{j=1}^{d_{vmax}} v_j x^{j-1}, \quad (1)$$

and $$c(x) = \sum_{j=1}^{d_{cmax}} c_j x^{j-1}, \quad (2)$$

where the variables $d_{v\,max}$ and $d_{c\,max}$ are a maximum variable node degree and a maximum check node degree, respectively, and $v_j(c_j)$ represents the fraction of edges emanating from variable (check) nodes of degree j. It has been shown, both theoretically and empirically, that with properly selected degree distributions, irregular LDPC codes outperform regular LDPC codes.

The regular and irregular LDPC codes can be decoded by hard-decision, soft-decision and hybrid-decision methods. The best soft decision decoding is BP, which gives the best error performance of LDPC codes.

BP Decoding

As shown in FIG. 1 for conventional BP decoding, the check node processor 110 and a bit node processor 120 operate serially while passing reliability messages to each other based on the belief propagation principle, where $U_{ch}$ 130 is a log-likelihood ratio from channel. The main difficulty for a practical implementation of a BP decoder arises from the check processor, in which a "tanh" function requires very high computational complexity.

We denote the set of bits that participate in check m by N(m), and the set of checks in which bit n participates by M(n). We also denote N(m)\n as the set N(m) with bit n excluded, and M(n)\m as the set M(n) with check m excluded.

We define the following notations associated with $i^{th}$ iteration:

$U_{ch,n}$: the log-likelihood ratios (LLR) of bit n which is generated by the channel output, $U_{mn}^{(i)}$: the LLR of bit n which is sent from check m to bit node n, $V_{mn}^{(i)}$: The LLR of bit n which is sent from bit node n to check node m, and $V_n^{(i)}$: the a posteriori LLR of bit n computed at each iteration.

The conventional BP decoding method includes the following steps:

Initialization

Set i=1 and the maximum number of iterations to $I_{max}$. For each m and n, set $V_{mn}^{(0)} = U_{ch,n}$.

Step 1

Horizontal step, for $1 \leq n \leq N$ and each $m \in M(n)$, process:

$$U_{mn}^{(i)} = \log \frac{1 + \prod_{n' \in N(m)\backslash n} \tanh(V_{mn'}^{(i-1)}/2)}{1 - \prod_{n' \in N(m)\backslash n} \tanh(V_{mn'}^{(i-1)}/2)}. \quad (3)$$

Vertical step, for $1 \leq n \leq N$ and each $m \in M(n)$, process $$V_{mn}^{(i)} = U_{ch,n} + \sum_{m' \in M(n)\backslash m} U_{m'n}^{(i)}, \text{ and} \quad (4)$$

-continued $$V_n^{(i)} = U_{ch,n} + \sum_{m \in M(n)} U_{mn}^{(i)}. \quad (5)$$

Step 2

Hard decision and termination criterion test. Generate $\hat{W}^{(i)} = [\hat{W}_n^{(i)}]$, such that $\hat{w}_n^{(i)} = 1$ for $V_n^{(i)} > 0$, and $\hat{w}_n^{(i)} = 0$ otherwise. If $H\hat{w}^{(i)} = 0$, or the maximum number of iterations is reached, then output $\hat{w}^{(i)}$ as the decoded codeword and terminate the decoding iteration, otherwise, set i=i+1, and go to Step 1.

Step 3

Output $\hat{w}^{(i)}$ as the decoded codeword.

Min-sum Decoding

As shown in FIG. 2, conventional min-sum decoding simplifies the conventional BP decoding in the check node processor 210 by approximating the product of tanh functions as a min-sum operation. The updating rule in the check node of min-sum is modified as:

$$U_{mn}^{(i)} = \prod_{n' \in N(m) \backslash n} sgn(V_{mn'}^{(i-1)}) \times \min_{n' \in N(m) \backslash n} |V_{mn'}^{(i-1)}|. \quad (6)$$

Min-sum decoding is possible in hardware because only comparison and addition operations are needed. Nevertheless, the conventional min-sum decoding has decreased performance.

Conventional Normalized Min-Sum Decoding

As shown in FIG. 3, conventional normalized min-sum decoding improves the min-sum decoding by normalizing 310 the messages generated by the check node processor 210, where 'A' 300 denotes the normalization factor. The updating rule in the check node of normalized min-sum decoding is as follows:

$$U_{mn}^{(i)} = A \prod_{n' \in N(m) \backslash n} sgn(V_{mn'}^{(i-1)}) \times \min_{n' \in N(m) \backslash n} |V_{mn'}^{(i-1)}|. \quad (7)$$

The normalized min-sum decoding method performs near to that of conventional BP when decoding regular LDPC codes. Nevertheless, for decoding irregular LDPC codes, which are preferred for many applications, the gap between the performance of conventional normalized min-sum decoding and that of BP is large.

Therefore is desired to improve the normalized min-sum decoding method for all LDPC codes.

SUMMARY OF THE INVENTION

In a 2D normalization min-sum decoding method, messages generated by a check node and messages generated by a bit node in min-sum decoding are both normalized. This decoding has significantly improved performance when compared with conventional min-sum and normalization min-sum decoding methods.

At the same time, the 2D normalization min-sum decoding has a similar and better performance than BP decoding method, in waterfall and error floor regions.

Furthermore, the 2D normalization min-sum decoding method requires much less computational complexity than conventional BP decoding. The 2D normalization min-sum decoding can also be extended to 2D offset min-sum decoding.

DETAILED DESCRIPTION OF THE PREFERRED EMBODIMENT

In one embodiment of our invention, we provide a 2D-normalized min-sum decoder for error-correcting codes, such as regular and irregular LDPC codes and regular and irregular repeat-accumulate codes.

In conventional normalization min-sum decoding, the belief messages generated by a check processor are post-processed by a normalization operation. Then, these normalized belief messages are operated on by a bit node processor, which is the same as in the conventional BP decoding method.

For an irregular LDPC code, the degrees of bits are not constant. Therefore, probability distributions of belief messages generated from bits with different weights are not the same. It is not reasonable for the check node processor to treat these messages with different degrees equally.

Therefore, in one embodiment of the invention, the messages generated by the bit node processor are normalized as well. In addition, varying normalization factors are used, which are mainly dependent on different weights of bit nodes. Because there are two normalization operations, we call our method 2D normalization min-sum decoding.

Another consideration is to use varying normalization factors, which means the normalization factors of bit and check nodes can vary during different decoding iterations. For example, the normalization factors for the check node processor depend on a first predetermined number of decoding iterations (e.g., 10), while the normalization factors are constant during remaining decoding iterations. In addition, or alternatively, the normalization factors for the bit node processor depend on a predetermined number of first decoding iterations (e.g., 10), while the normalization factors are constant during remaining decoding iteration.

In summary, we provide the following procedures to improve the performance of conventional min-sum and normalized min-sum decoding:

We normalize the messages generated by the check node processor, and we normalize the messages generated by the bit node processor. The normalization factors for bit processor are dependent on the weights of different bit nodes, and the normalization factors of check and bit node processors are dependent on the number of decoding iterations.

Figure 1:
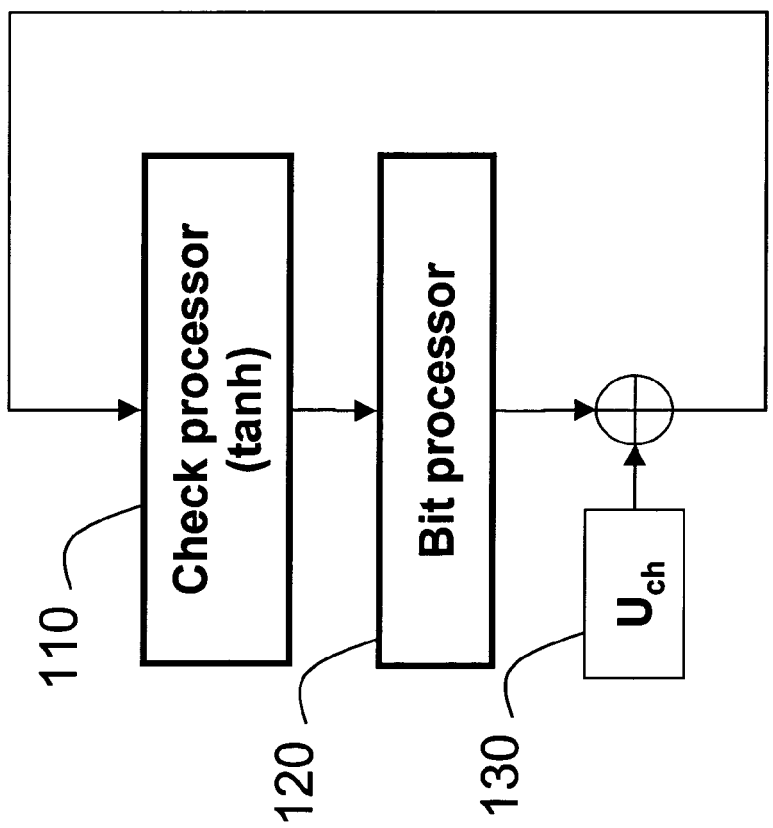
FIG. 1 is a block diagram of a conventional BP decoder of LDPC codes.
Figure 2:
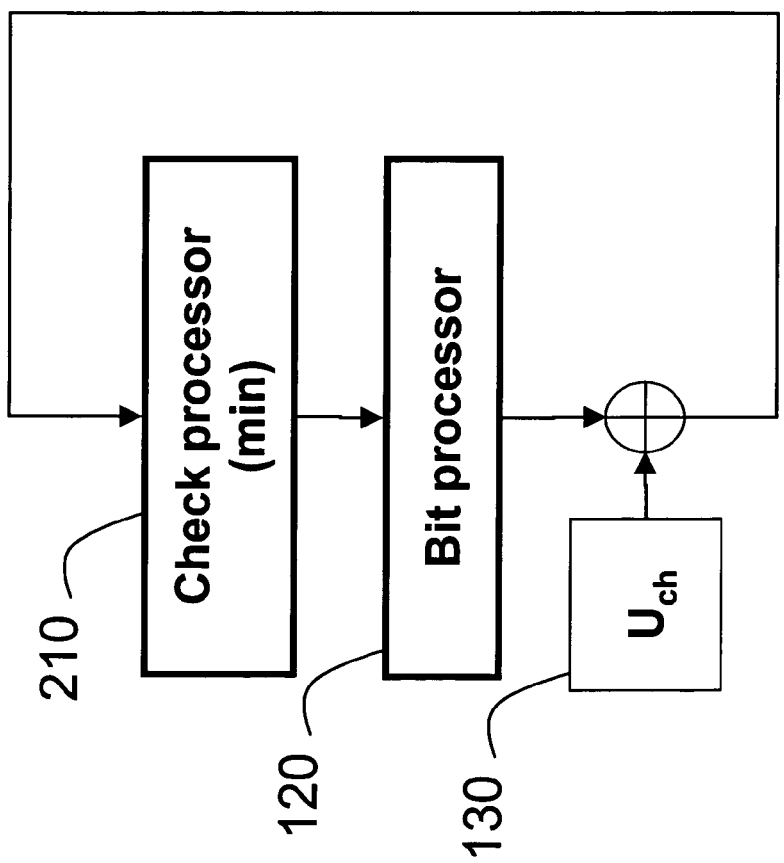
FIG. 2 is a block diagram of a conventional min-sum decoder of LDPC codes.
Figure 3:
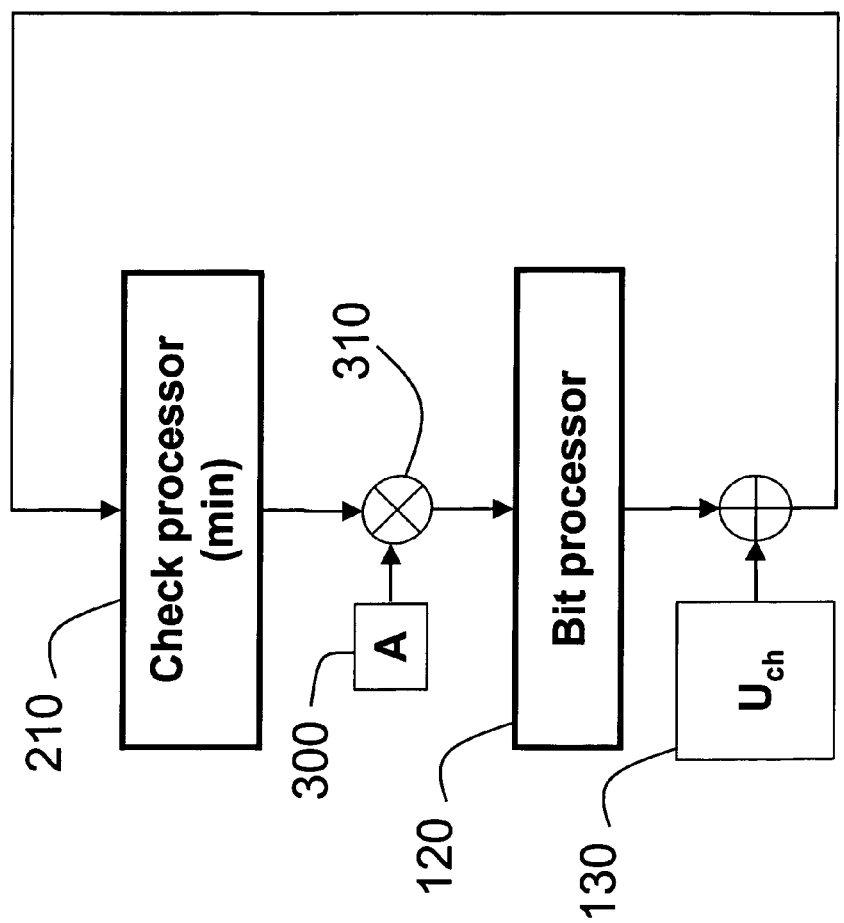
FIG. 3 is a block diagram of a conventional normalized min-sum decoder of LDPC codes.
Figure 4:
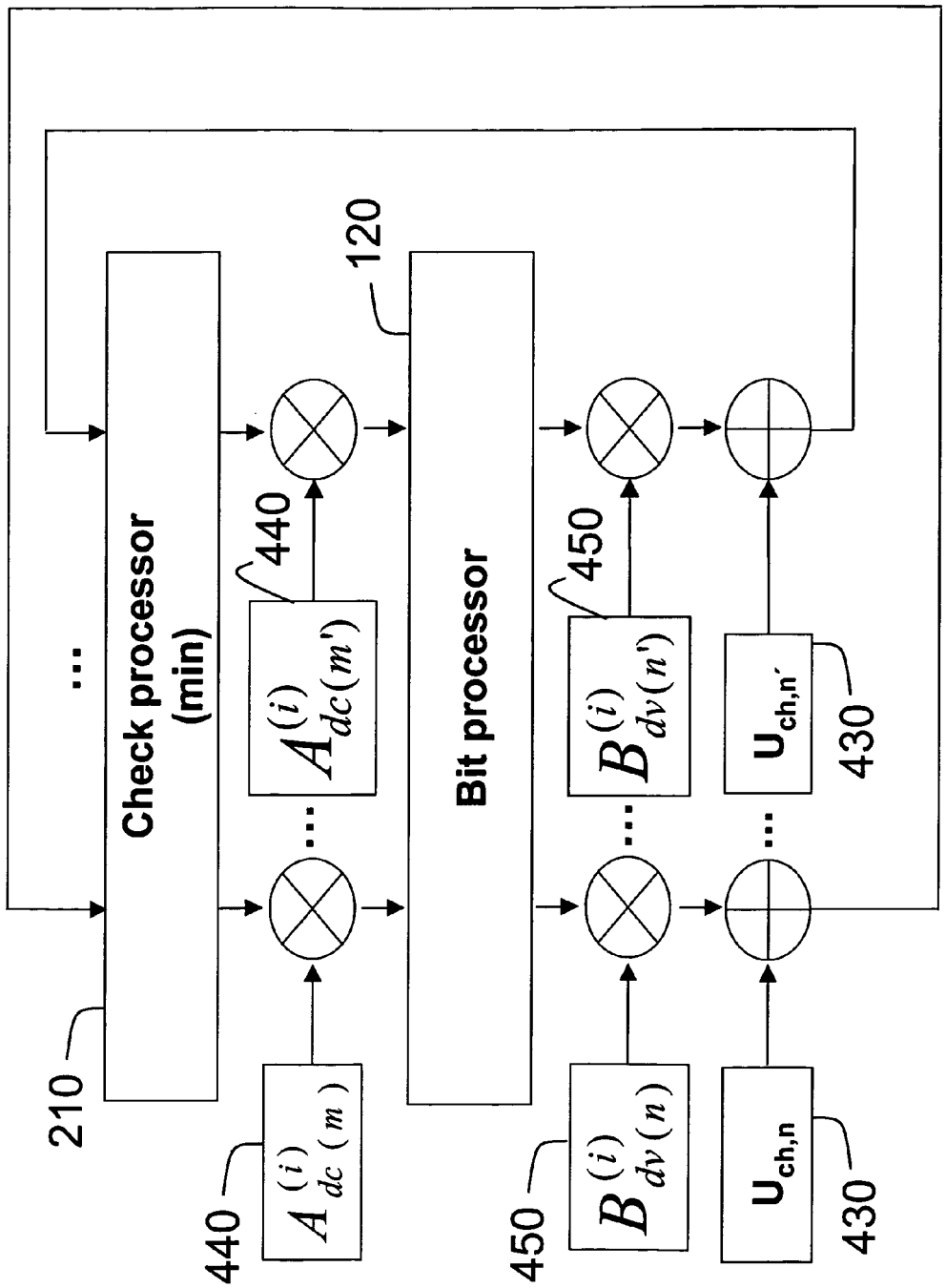
FIG. 4 is a block diagram of a 2D normalized min-sum decoder of error-correcting codes according to one embodiment of the invention.

FIG. 4 shows a 2D normalized min-sum decoder of error-correcting codes according to one embodiment of the invention. Let H be the parity check matrix defining an LDPC code. We denote the set of bits that participate in check m by N(m), and the set of checks in which bit n participates as M(n). We also denote N(m)\n as the set N(m) with bit n excluded, and M(n)\m as the set M(n) with check m excluded. Let $U_{ch,n}$ 430 be the log-likelihood ratio (LLR) of bit n, which is derived from the channel output. Let $U_{mn}^{(i)}$ be the LLR of bit n, which is sent from check node m to bit node n at $i^{th}$ decoding iteration. Let $V_{mn}^{(i)}$ be the LLR of bit n, which is sent from bit node n to check node m.

The normalized check node processor in 2D-normalized min-sum decoding is performed as follows:

$$U_{mn}^{(i)} = A_{dc(m)}^{(i)} \prod_{n' \in N(m)\backslash n} sgn(V_{mn'}^{(i-1)}) \min_{n' \in N(m)\backslash n} |V_{mn'}^{(i-1)}|, \quad (8)$$

where dc(m) denotes the degree of check node m and $A_{dc(m)}^{(i)}$ 440 denotes the normalization factor of check node m at iteration i.

The normalized bit node processor in 2D-normalized min-sum decoding is performed as:

$$V_{mn}^{(i)} = U_{ch,n} + B_{dv(n)}^{(i)} \sum_{m' \in M(n)\backslash m} U_{m'n}^{(i)}, \quad (9)$$

where dv(n) denotes the degree of bite node n and $B_{dv(n)}^{(i)}$ 450 denotes the normalization factor of bit node n at iteration i.

Step 1 of 2D-normalized min-sum decoding includes the following substeps:

Horizontal Step, $1 \leq n \leq N$ and each $m \in M(n)$, process $$U_{mn}^{(i)} = A_{dc(m)}^{(i)} \prod_{n' \in N(m)\backslash n} sgn(V_{mn'}^{(i-1)}) \min_{n' \in N(m)\backslash n} |V_{mn'}^{(i-1)}|. \quad (10)$$

Vertical Step, for $1 \leq n \leq N$ and each $m \in M(n)$, process $$V_{mn}^{(i)} = U_{ch,n} + B_{dv(n)}^{(i)} \sum_{m' \in M(n)\backslash m} U_{m'n}^{(i)}, \text{ and} \quad (11)$$

$$V_n^{(i)} = U_{ch,n} + B_{dv(n)}^{(i)} \sum_{m \in M(n)} U_{mn}^{(i)}. \quad (12)$$

Because there are two normalization operations, one in a horizontal step and the other in a vertical step, we call our method 2D normalization min-sum decoding.

Step 2 and Step 3 are the same as in the conventional normalized min-sum decoding, i.e. Step 2 and Step 3 of conventional BP decoding.

The 2D-normalized min-sum decoding for irregular LDPC codes can be extended to 2D offset min-sum decoding. In offset min-sum decoding, belief messages have absolute values equal or greater than an offset parameter x. In this case, the magnitudes of these messages are reduced by x, otherwise, belief messages are set to zero.

The main reason to use the offset operation is to reduce correlation between decoding iterations, and to suppress error propagation. As for the conventional offset min-sum decoding, only messages sent from check nodes are reprocessed with offset operations. Nevertheless, in 2D offset min-sum decoding, both messages generated by check and bit nodes are reprocessed with offset operation.

Step 1 of 2D offset min-sum decoding is described below.
Horizontal Step, $1 \leq n \leq N$ and each $m \in M(n)$, process $$U_{mn}^{(i)} = \prod_{n' \in N(m)\backslash n} sgn(V_{mn'}^{(i-1)}) \max\left(\min_{n' \in N(m)\backslash n} |V_{mn'}^{(i-1)}| - A_{dc(m)}^{(i)}, 0\right). \quad (13)$$

Vertical Step, for $1 \leq n \leq N$ and each $m \in M(n)$, process $$V_{mn}^{(i)} = U_{ch,n} + sgn\left(\sum_{m' \in M(n)\backslash n} U_{m'n}^{(i)}\right) \max\left(\left|\sum_{m' \in M(n)\backslash n} U_{m'n}^{(i)}\right| - B_{dv(n)}^{(i)}, 0\right), \quad (14)$$

and $$V_n^{(i)} = U_{ch,n} + sgn\left(\sum_{m \in M(n)} U_{mn}^{(i)}\right) \max\left(\left|\sum_{m \in M(n)} U_{mn}^{(i)}\right| - B_{dv(n)}^{(i)}, 0\right). \quad (15)$$

Step 2 and Step 3 are the same as described above.

The 2D offset min-sum decoding offers a similar performance gain as the 2D-normalized min-sum decoding described above.

It should be understood that in other embodiments of the invention the method is applied regular and irregular repeat-accumulate codes.

EFFECT OF THE INVENTION

Analysis of the 2D-normalized min-sum decoder indicates better performance, less complexity and decoding speed trade-offs than prior art decoders.

Figure 5:
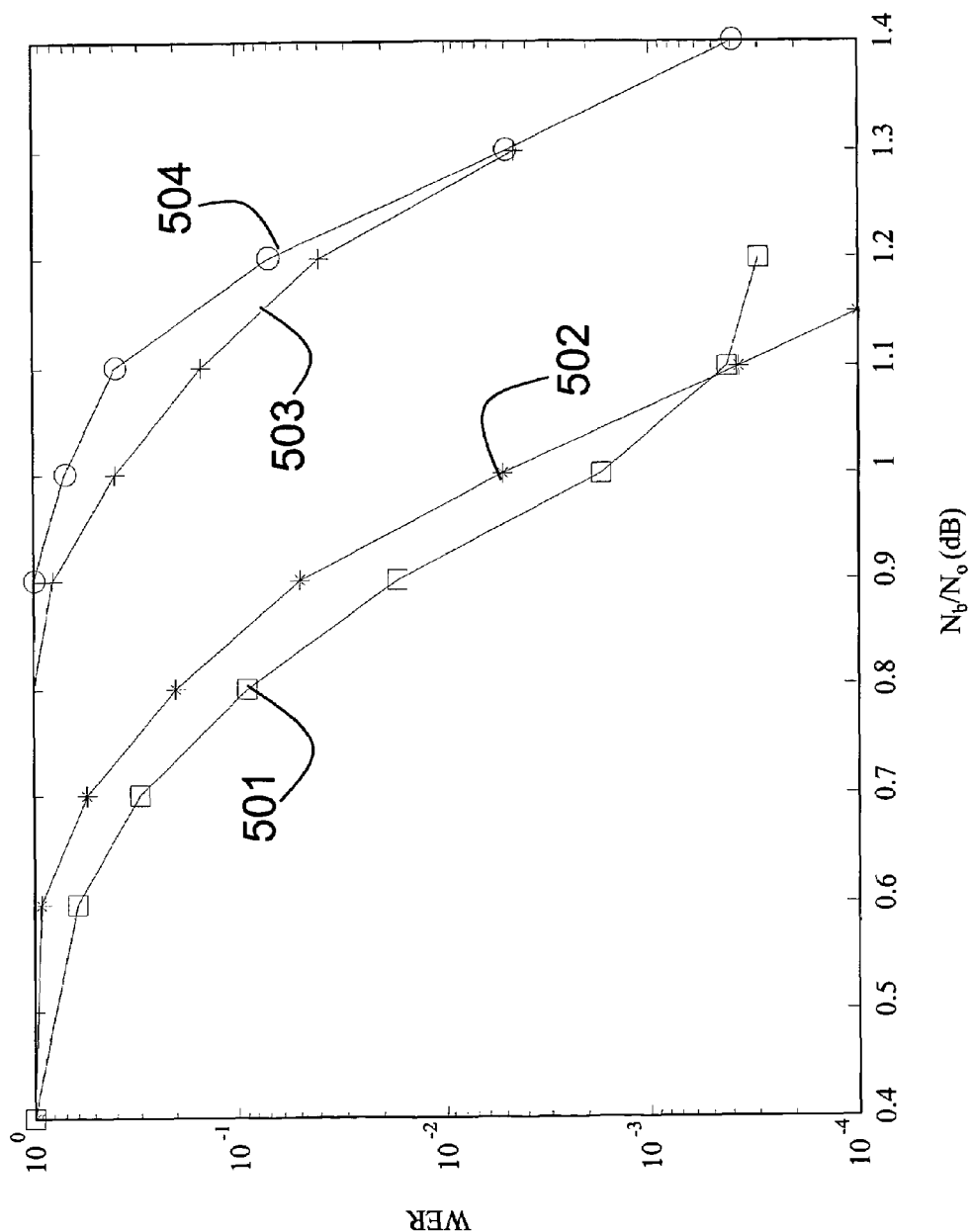
FIG. 5 is a graph comparing word-error rates (WER) of decoding methods.

FIG. 5 compares the word error rate of the conventional BP decoding 501, 2D-normalized min-sum decoding 502, conventional normalized min-sum decoding 503, and min-sum decoding 504, for decoding the (16200,7200) irregular LDPC code with $I_{max}$=200. The 2D-normalized min-sum decoding method provides a comparable performance as BP decoding, and, interestingly has a lower error floor than that of BP decoding in a high SNR region.

Although the invention has been described by the way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for decoding error-correcting codes, comprising:
    normalizing messages generated by a bit node processor;
    normalizing messages generated by the check node processor; and
    replacing a normalization with an offset operation, in which messages generated from both a check node processor and the bit node processor are processed with offset operations, in which belief messages with absolute values equal to or greater than an offset parameter x have a magnitudes reduced by x, otherwise, the belief messages are set to zero.

2. The method of claim 1, in which normalization factors for the bit processor depend on weights of different bit nodes.

3. The method of claim 2, in which the normalization factor for the bit node processor only normalizes messages generated by the check node processor.

4. The method of claim 2, in which the normalization factors for the check node processor depend on a first predetermined number of decoding iterations, while the normalization factors are constant during remaining decoding iterations.

5. The method of claim 2, in which the normalization factor for the check node processor only normalizes messages from the bit node processor.

6. The method of claim 2, in which the normalization factors for the bit node processor depend on a predetermined number of first decoding iterations, while the normalization factors are constant during remaining decoding iteration.

7. The method of claim 2, in which the normalization factors for bit node processor are constant during all decoding iterations.

8. The method of claim 1, in which the error-correcting codes are LDPC codes.

9. The method of claim 8, in which the LDPC codes are irregular.

10. The method of claim 1, in which normalization factors of the check node processor and the bit node processor depend on a number of decoding iterations.

11. The method of claim 1, in which the error-correcting codes are regular repeat-accumulate codes.

12. The method of claim 1, in which the error-correcting codes are irregular repeat-accumulate codes.

* * * * *